United States Patent
Yoo et al.

(10) Patent No.: US 10,636,852 B2
(45) Date of Patent: Apr. 28, 2020

(54) ORGANIC LIGHT EMITTING DISPLAY DEVICE

(71) Applicant: LG DISPLAY CO., LTD., Seoul (KR)

(72) Inventors: Seungwon Yoo, Paju-si (KR); Jaesung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/210,242

(22) Filed: Dec. 5, 2018

(65) Prior Publication Data
US 2019/0172881 A1 Jun. 6, 2019

(30) Foreign Application Priority Data
Dec. 6, 2017 (KR) .......................... 10-2017-0167047

(51) Int. Cl.
| H01L 35/24 | (2006.01) |
| H01L 51/00 | (2006.01) |
| H01L 27/32 | (2006.01) |
| H01L 51/52 | (2006.01) |
| G09G 3/3291 | (2016.01) |
| G09G 3/3233 | (2016.01) |

(52) U.S. Cl.
CPC ....... *H01L 27/3246* (2013.01); *G09G 3/3291* (2013.01); *H01L 27/326* (2013.01); *H01L 27/3258* (2013.01); *H01L 51/5206* (2013.01); *H01L 51/5218* (2013.01); *H01L 51/5221* (2013.01); *H01L 51/5237* (2013.01); *G09G 3/3233* (2013.01); *G09G 2300/0426* (2013.01); *G09G 2310/08* (2013.01)

(58) Field of Classification Search
CPC ............. H01L 27/3246; H01L 51/5206; H01L 51/5221; H01L 51/5237; G09G 3/3291
USPC .......................................................... 257/40
See application file for complete search history.

(56) References Cited

U.S. PATENT DOCUMENTS

| 2015/0034932 A1* | 2/2015 | Choi ................... H01L 27/3258 257/40 |
| 2015/0034935 A1 | 2/2015 | Choi |
| 2017/0133444 A1 | 5/2017 | Lee et al. |
| 2019/0019966 A1* | 1/2019 | Jiang ................... H01L 51/0097 |
| 2019/0165064 A1* | 5/2019 | Lee ..................... H01L 51/5228 |

(Continued)

FOREIGN PATENT DOCUMENTS

| KR | 20140082090 A | 7/2014 |
| TW | 201640674 | * 11/2016 |
| TW | 201640674 A | 11/2016 |

OTHER PUBLICATIONS

Office Action dated Nov. 5, 2019 issued in corresponding Taiwanese Application No. 107141717 (12 pages).

*Primary Examiner* — David S Blum
(74) *Attorney, Agent, or Firm* — Polsinelli PC (57) ABSTRACT

Disclosed is an organic light emitting display device including a passivation layer, a planarization layer, a cover layer, and a bank layer. The passivation film may cover a first area, in which an organic light emitting diode is disposed, and a second area adjacent to the first area. The planarization layer may be disposed on the passivation film in the first area. The cover layer may be disposed to surround the planarization layer on the passivation film. The bank layer may cover at least an edge of an upper part of the planarization layer, and separate the first area.

20 Claims, 6 Drawing Sheets

(56) References Cited

U.S. PATENT DOCUMENTS

2019/0181301 A1* 6/2019 Kim ................. H01L 33/44
2019/0198799 A1* 6/2019 Lee ................. H01L 51/5228

* cited by examiner

ORGANIC LIGHT EMITTING DISPLAY DEVICE

CROSS REFERENCE TO RELATED APPLICATION

This application claims the benefit of Korea Patent Application No. 10-2017-0167047 filed on Dec. 6, 2017, the entire contents of which is incorporated herein by reference for all purposes as if fully set forth herein.

BACKGROUND

Field of the Disclosure

The present disclosure relates to an organic light emitting display device.

Description of the Background

An organic light emitting device among flat panel display devices is a self-luminescent display device that emits light by electrically exciting an organic compound. Since an organic light emitting device does not require a backlight that should be used in a liquid crystal display (LCD) device, a decrease in weight and thickness of the LCD is possible and manufacturing processes can be simplified. Further, the organic light emitting device can be manufactured in a low temperature, has a high response speed of 1 ms or less, and has characteristics such as low power consumption, a wide viewing angle, and a high contrast.

Recently, there are proposed technologies for forming a partial area of a display panel as a transparent part allowing light to passing therethrough so that a display device can be used as a transparent display device. Each pixel in a display panel of a transparent display device includes an organic light emitting diode and thus divided into a light emitting unit, which displays an image, and a light transmitting unit which transmits light. To increase a transmittance, a metal material is not disposed in a light transmitting unit of an organic light emitting display: instead, an array layer is minimized. As a result, there are irregularities in the boundary between the light emitting unit and the light transmitting unit, and a new problem occurs due to difference in disposed array layers.

Thus, the present disclosure is proposed to provide an organic light emitting display device which solves a problem that occurs due to a structural characteristic in a boundary between a first area which displays an image and a second area which transmits light.

SUMMARY

In one aspect of the present disclosure, there is provided an organic light emitting display device including a passivation layer, a planarization layer, a cover layer, and a bank layer. The passivation film may cover a first area, in which an organic light emitting diode is disposed, and a second area adjacent to the first area. The planarization layer may be disposed on the passivation film in the first area. The cover layer may be disposed to surround the planarization layer on the passivation film. The bank layer may cover at least an edge of an upper part of the planarization layer, and separate the first area.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION OF THE ASPECTS

Hereinafter, exemplary aspects of this disclosure will be described in detail with reference to the accompanying drawings, wherein same reference numerals may be used to denote the same or substantially the same elements throughout the specification and the drawings. In the following description, well-known functions or constructions related to this disclosure are not omitted if they would obscure gist of this disclosure in unnecessary.

It will be understood that although the terms first, second, etc. may be used herein to describe various elements, these elements should not be limited by these terms. These terms are generally only used to distinguish one element from another.

Figure 1:
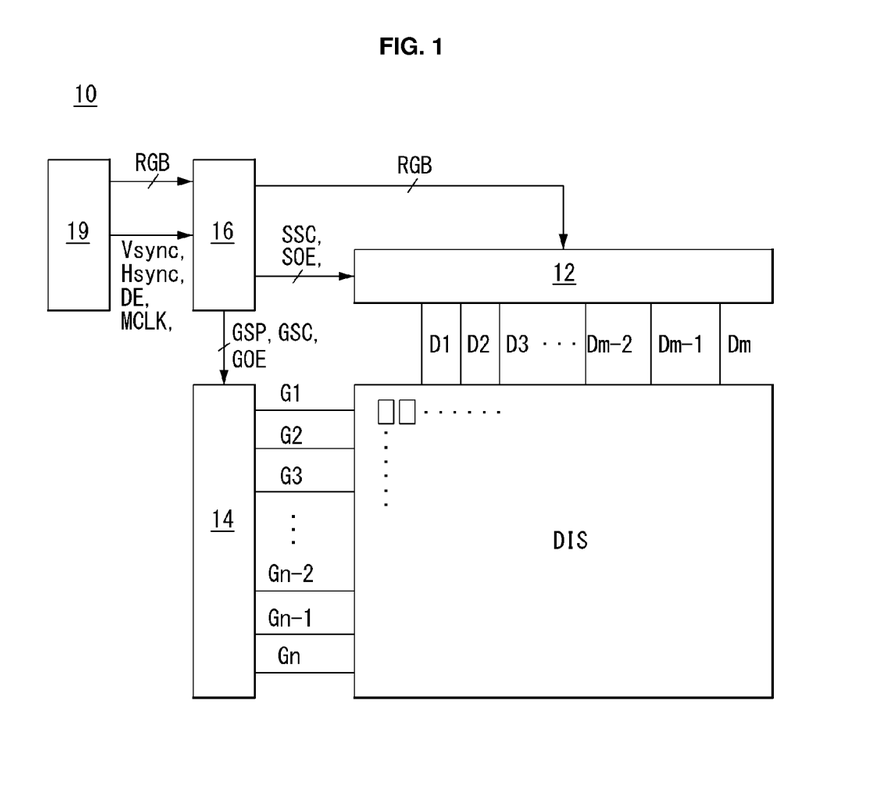
FIG. 1 is a block diagram schematically illustrating an organic light emitting display device.
Figure 2:
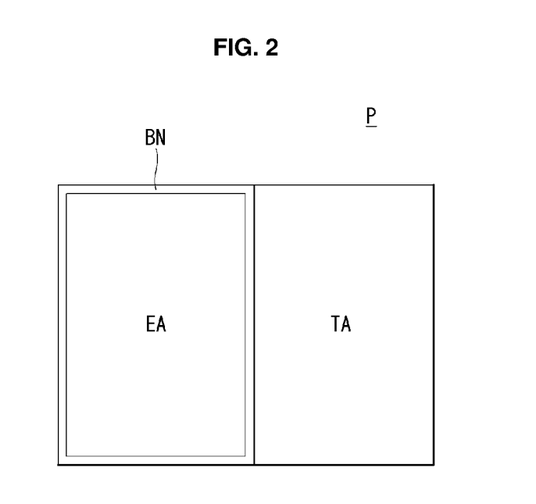
FIG. 2 is a schematic diagram illustrating separated areas of a pixel.

FIG. 1 is a block diagram schematically illustrating an organic light emitting display device. FIG. 2 is a diagram schematically illustrating configuration of a pixel shown in FIG. 1.

Referring to FIG. 1, an organic light emitting display device 10 includes a display driving circuit and a display panel DIS.

The display driving circuit includes a data driving circuit 12, a gate driving circuit 14, and a timing controller 16, and writes a video data voltage of a received image into pixels of the display panel DIS. The data driving circuit 12 generates a data voltage by converting digital video data RGB received from the timing controller 16 into an analog gamma compensation voltage. A data voltage output from the data driving circuit 12 is supplied to data lines D1 to Dm.

The gate driving circuit 14 supplies a gate signal in sync with the data voltage to gate lines G1 to Gn, sequentially, and selects pixels of the display panel DIS into which the data voltage is written.

The timing controller 16 receives a timing signal, such as a vertical synchronization signal Vsync, a horizontal synchronization signal Hsync, a data enable signal DE, and a main clock MCLK, from a host system 19 to synchronize an operation timing of the data driving circuit 12 and an operation timing of the gate driving circuit 14 with each other. A data timing control signal for controlling the data driving circuit 12 includes a source sampling clock (SSC), a source output enable signal SOE, etc. A gate timing control signal for controlling the gate driving circuit 14 includes a gate start pulse GSP, a gate shirt clock GSC, a gate output enable signal GOE, etc.

The host system 19 may be implemented as any one of a television system, a set top box, a navigation system, a DVD player, a Blu-ray player, a personal computer (PC), a home theater system, and a phone system. The host system 19 includes a System on Chip (SoC) embedded with a scaler and converts digital video data RGB of a received image to a format suitable to display the received image on the display panel DIS. The host system 19 transmits timing signals Vsync, Hsync, DE, and MCLK in addition to the digital video data to the timing controller 16.

The display panel DIS includes a pixel array. The pixel array includes pixels which are defined by the data lines D1 to Dm (m is a positive integer) and the gate lines G1 to Gn (n is a positive integer). Each of the pixels includes an organic light emitting diode which is a self-emitting element.

FIG. 2 is a schematic diagram illustrating a flat array of a pixel.

Referring to FIG. 2, a pixel P includes a light transmitting unit TA which transmits light and thus appears transparent, and a light emitting unit EA which displays an image.

It is desirable that the light transmitting unit TA does not have a non-transparent metal layer disposed therein in order to transmit light.

Figure 3:
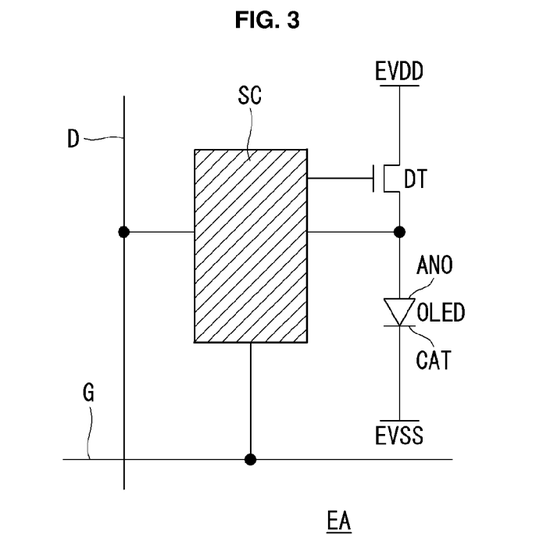
FIG. 3 is a diagram illustrating an example of a pixel disposed in a light emitting unit.

FIG. 3 is a schematic diagram illustrating configuration of the light emitting unit of the pixel.

Referring to FIG. 3, a plurality of data lines D and a plurality of gate lines G are intersecting with each other in the light emitting unit EA of the display panel DIS, and pixels are arranged in a matrix form at intersections of the data lines D and the gate lines G. Each pixel P includes an organic light emitting diode OLED, a driving transistor DT for controlling an amount of current flowing through the organic light emitting diode OLED, and a programming unit SC for controlling operation of the driving transistor DT. The programming unit SC is composed of one or more transistors and one or more capacitors, and controls voltages of major nodes such as a gate electrode and a source electrode of the driving transistor DT. For example, in response to a gate pulse applied from the gate line G, the programming unit SC writes a data voltage, received from the data line D, into the programming unit SC. The driving transistor DT supplies a driving current, which is proportional to a size of the data voltage written into the programming unit SC, to the organic light emitting diode OLED. The organic light emitting diode OLED emits light in proportion to a size of the driving current supplied from the driving transistor DT. The organic light emitting diode OLED includes an anode ANO, a cathode CAT, and an organic compound layer interposed between the anode ANO and the cathode CAT. The anode ANO is connected with the driving transistor DT.

Figure 4:
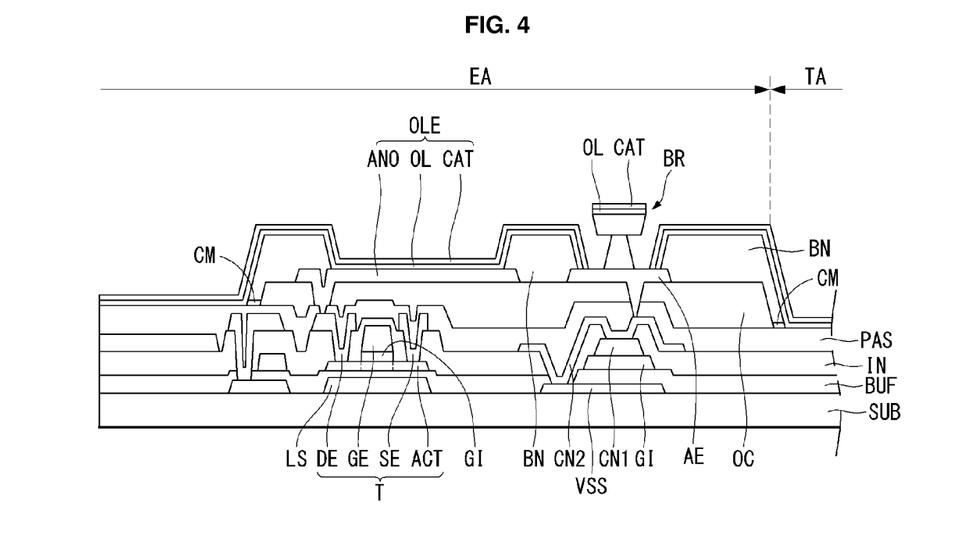
FIGS. 4 and 5 are cross-sectional views illustrating an organic light emitting display device according to an aspect of the present disclosure.
Figure 5:
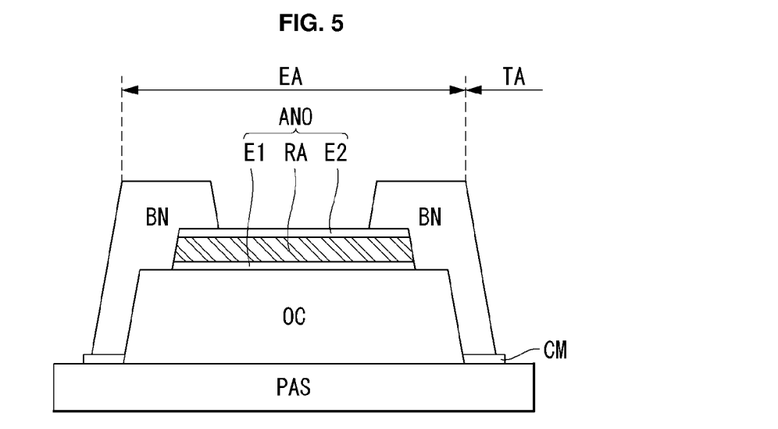

FIGS. 4 and 5 are cross-sectional views of an organic light emitting display device according to an aspect of the present disclosure. FIG. 5 is a schematic diagram illustrating an upper area of a passivation layer shown in FIG. 4.

Referring to FIGS. 4 and 5, the organic light emitting display device according to the present disclosure includes a transistor T and an organic light emitting diode OLED which are formed on a substrate SUB.

The substrate SUB may be formed of a glass or plastic material. For example, the substrate SUB may be formed of PI (Polyimide), PET (polyethylene terephthalate), PEN (polyethylene naphthalate), PC (polycarbonate), etc. and thus has a flexible characteristic.

A light shielding layer LS and a low-potential voltage line VSS are disposed on the substrate SUB. The light shielding layer LS is disposed to overlap a semiconductor layer of the transistor T, especially a channel, on a plane so as to protect an oxide semiconductor element from external light.

A buffer layer BUF is disposed on the substrate SUB to cover the light shielding layer LS and the low-potential voltage line VSS. The buffer layer BUF prevents ions or any foreign substance from spreading on the substrate SUB, and prevents external moisture from permeating into the substrate SUB.

A semiconductor layer ACT is disposed on the buffer layer BUF.

By patterning an insulating film formed on the buffer layer BUF to cover the semiconductor layer ACT, so a gate insulating film GI is disposed at a position where a gate electrode GE and a first auxiliary connector CN1 are to be formed.

The gate insulating film GI insulates the gate electrode GE and may be composed of a silicon oxygen film (SiOx).

The gate electrode GE and the first auxiliary connector CN1 are disposed on the gate insulating film GI.

The gate electrode GE is disposed to face the semiconductor layer ACT with the gate insulating film GI therebetween. The gate electrode GE may be composed of a single layer or multiple layers formed of copper (Cu), molybdenum (Mo), aluminum (Al), chrome (Cr), gold (Au), titanium (Ti), nickel (Ni), neodymium (Nd), tantalum (Ta), tungsten (W), or alloys thereof.

An interlayer insulating film IN is disposed on the buffer layer BUF to cover the gate electrode GE and the first auxiliary connector CN1. The interlayer insulating film IN insulates the gate electrode GE and a source/drain electrode SE or DE from each other, and may be formed of one of a silicon oxide film (SiOx), a silicon nitride film (SiNx), and multiple layers thereof.

The source/drain electrode SE or DE and a second auxiliary connector CN2 are disposed on the interlayer insulating film IN.

The source electrode SE and the drain electrode DE are spaced a predetermined distance apart from each other. The source electrode SE comes into contact with one side of the semiconductor layer ACT through a source contact hole which penetrates the interlayer insulating film IN. The drain electrode DE comes into contact the other side of the semiconductor layer ACT through a drain contact hole which penetrates the interlayer insulating film IN. The source electrode SE and the drain electrode DE may be composed of a single layer or multiple layers. The source electrode SE and the drain electrode DE, if composed of a single layer, may be composed of molybdenum (Mo), aluminum (Al), chrome (Cr), gold (Au), titanium (Ti), nickel (Ni), neodymium (Nd), copper (Cu), or alloys thereof. The source electrode SE and the drain electrode DE, if composed of multiple layers, may be composed of two layers of molybdenum/aluminum-neodymium, molybdenum/aluminum, or titanium/aluminum, or three layers of molybdenum/aluminum-neodymium/molybdenum, molybdenum/aluminum/molybdenum, titanium/aluminum/titanium, or molybdenum titanium/copper/molybdenum titanium.

The second auxiliary connector CN2 penetrates the interlayer insulating film IN to be connected with the first auxiliary connector CN1. In addition, the second auxiliary connector CN2 penetrates the buffer layer BUF and the interlayer insulating film IN to be connected with the low-potential voltage line VSS.

The semiconductor layer ACT, the gate electrode GE, and the source/drain electrode SE or DE form the transistor T.

A passivation layer PAS is positioned on the transistor T. The passivation film PAS protects the transistor T, and may be formed of silicon oxide (SiOx), silicon nitride (SiNx), or multiple layers thereof.

A planarization layer OC is positioned on the passivation film PAS. The planarization layer OC makes irregularities thereunder flat, and may be formed of an organic material such as photo acryl, polyimide, benzocyclobutene resin, acrylate resin, etc. If necessary, any one of the passivation film PAS and the planarization layer OC may be omitted.

An anode ANO and an auxiliary electrode AE are disposed on the planarization layer OC. In addition, a cover layer CM is disposed on a side surface of the planarization layer OC. The cover layer CM may be formed of the same material as that of a first electrode E1 of the anode ANO.

Figure 6:
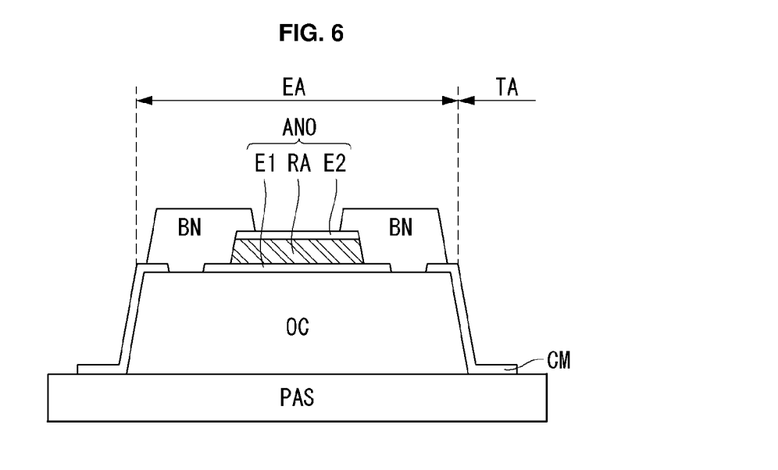
FIG. 6 is a diagram illustrating an organic light emitting display device according to another aspect of the present disclosure.

The anode ANO is connected with the drain electrode DE of the transistor T through a contact hole which penetrates the passivation film PAS and the planarization layer OC. The anode ANO may be composed of multiple layers including a reflective layer RA, as shown in FIGS. 5 and 6, and thus able to function as a reflective electrode. The reflective layer RA may be composed of aluminum (Al), copper (Cu), silver (Ag), nickel (Ni), molybdenum titanium (MoTi), etc.

The auxiliary electrode AE may be formed on a layer identical to a layer on which the anode ANO is disposed, and may be formed of a material identical to a material of the anode ANO. In this case, it is not necessary to perform an additional process so as to form the auxiliary electrode AE, thereby reducing manufacturing time and cost.

A bank layer BN for separating a light emitting unit EA of the pixel P is positioned on the substrate SUB on which the anode ANO and the auxiliary electrode AE are formed. The bank layer BN may be formed of an organic material such as polyimide, benzocyclobutene resin, acrylate resin, etc.

The bank layer BN may be disposed to cover a side end of the anode ANO while exposing the center of the anode ANO. It is desirable that the exposed area of the anode ANO is designed at maximum to secure a sufficient aperture ratio. In addition, the bank layer BN may be disposed to cover a side end of the auxiliary electrode AE while exposing the center of the auxiliary electrode AE.

In particular, the bank layer BN is not disposed on the light transmitting unit TA in order to prevent a yellowish phenomenon in an area of the light transmitting unit TA. The yellowish phenomenon refers to a phenomenon in which faded yellow is displayed due to material properties of the planarization layer OC.

In addition, the bank layer BN is formed to cover a side surface of the planarization layer OC in order to prevent an outgassing phenomenon in the planarization layer OC. The outgassing phenomenon refers to the release of gas dissolved from the planarization layer OC, which is formed of an organic material, in the process of driving the organic light emitting display device. Due to the structure in which the bank layer BN is formed to cover the side surface of the planarization layer OC, an edge lower region of the bank layer BN is positioned on a passivation layer PAS. In the present disclosure, the cover layer CM is positioned on a side surface of the planarization layer OC, so an end of a side surface of the bank layer BN contacts the cover layer CM, not the passivation film PAS.

If the cover layer CM does not exists, the bank layer BN contacts the passivation film PAS by itself. In order to secure an area for the light transmitting unit TA, the bank layer BN needs to have a narrow width, and, as a result, a contact area between the bank layer BN and the passivation film PAS is inevitably narrow. Due to material properties, the bank layer BN and the passivation film PAS are not attached to each other well and even have the narrow contact area, and thus, the bank layer BN may come off the passivation film PAS.

On the contrary, in the present disclosure, the bank layer BN does not contact the passivation film PAS by itself, but instead the bank layer BN is disposed through the cover layer CM. Thus, it is possible to address the problem that the bank layer BN comes off the passivation film PAS.

The cover layer CM may be formed of a material which helps the bank layer BN and the passivation film PAS to be attached to each other. For example, the cover layer CM may be formed of a material identical to that of the first electrode E1 of the anode ANO. If the cover layer CM is formed of a material identical to that of the first electrode E1 of the anode ANO, an additional mask process is not required.

A partition BR is positioned on the auxiliary electrode AE. The partition BR physically separates an organic light emitting layer OL, a cathode CAT, and a protective film PAS2, each of which will be formed later, from each other. In other words, the organic light emitting layer OL, the cathode CAT, and the protective film PAS2 may be physically separated by the partition BR from each other on the auxiliary electrode AE and thus continuity thereof may be broken.

The organic light emitting layer OL is positioned on the substrate SUB on which the partition BR is formed. The organic light emitting layer OL may be formed widely on a front surface of the substrate SUB.

The organic light emitting layer OL is physically separated on the auxiliary electrode AE by the partition BR. As separated by the partition BR, the organic light emitting layer OL exposes at least part of the auxiliary electrode AE at the periphery of the partition BR. Part of the organic light emitting layer OL separated by the partition BR may be positioned in the upper part of the partition BR.

The cathode CAT is positioned on the organic light emitting layer OL. The cathode CAT may be formed widely over the front surface of the substrate SUB. The cathode CAT may be formed of a transparent conductive material such as Indium Tin Oxide (ITO) and Indium Zinc Oxide (IZO), and may be formed of magnesium (Mg), calcium (Ca), aluminum (Al), silver (Ag), or alloys thereof which have a thickness thin enough to allow light to pass therethrough.

The cathode CAT is physically separated on the auxiliary electrode AE by the partition BR. As separated by the partition BR, the cathode CAT exposes at least part of the auxiliary electrode AE at the periphery of the partition BR. Part of the cathode CAT separated by the partition BR is positioned in the upper part of the partition BR.

The cathode CAT is formed to cover the organic light emitting layer OL, while one end of the cathode CAT comes into direct contact with the auxiliary electrode AE. That is, one end of the cathode CAT exposed as being separated by the partition BR comes into direct contact with an exposed upper surface of the auxiliary electrode AE. This structure may be realized due to difference in step coverage between a material of the organic light emitting layer OL and a material of the cathode CAT. For example, the cathode CAT may be formed of a transparent conductive material having a higher step coverage than that of the material of the organic light emitting layer OL, and thus, the cathode CAT may be formed to come into direct contact with the auxiliary electrode AE.

As described above, in the organic light emitting display device according to an aspect of the present disclosure, the bank layer BN is attached to the passivation film PAS through the cover layer CM having good adhesion, and thus, it is possible to address the problem that the bank layer BN comes off the passivation film PAS.

FIG. 6 is a diagram illustrating a cover layer according to another aspect of the present disclosure. In description about the second aspect, detailed description of components similar to or substantially the same as the components of the above described aspect with respect FIG. 5 will be omitted.

Referring to FIG. 6, a planarization layer OC is disposed on a passivation layer PAS. The planarization layer OC is positioned in an area of a light emitting unit EA. A cover layer CM is positioned to cover a side surface of the planarization layer OC. The cover layer CM is disposed in an end region of the planarization layer OC to cover part of the passivation film PAS. The cover layer CM may prevent an outgassing phenomenon in the planarization layer OC. The cover layer CM may be formed of a material identical to a material of the first electrode E1 of the anode ANO.

In the above-described aspect with respect FIG. 5, the bank layer BN is disposed to cover a side surface of the planarization layer OC in order to prevent an outgassing phenomenon in the planarization layer OC.

Figure 7:
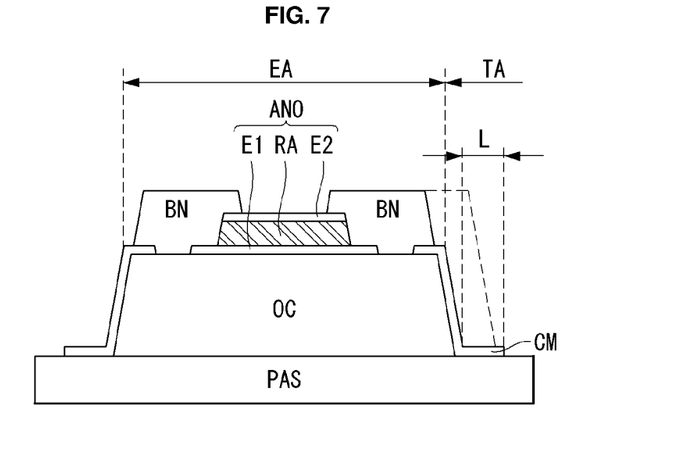
FIG. 7 is a diagram for explanation of the case where a transmittance increases in the another aspect of the present disclosure.

In the another aspect, since the cover layer CM is able to prevent the outgassing phenomenon in the planarization layer OC, a side surface of the bank layer BN is disposed not to go over the area of the planarization layer OC. For example, the bank layer BN may be positioned only on an upper area of the planarization layer OC. As a result, in the second aspect, the bank layer BN decreases in width compared to the first aspect. Since the bank layer BN decreases in width, a transmittance of the light transmitting unit TA increases as much as an area having a width "L", as shown in FIG. 7.

FIGS. 8A to 8E are diagrams illustrating a process of manufacturing the organic light emitting display device according to the first aspect. In particular, (a) and (e) of FIG. 8 illustrate a process of forming the cover layer CM.

Figure 8A:
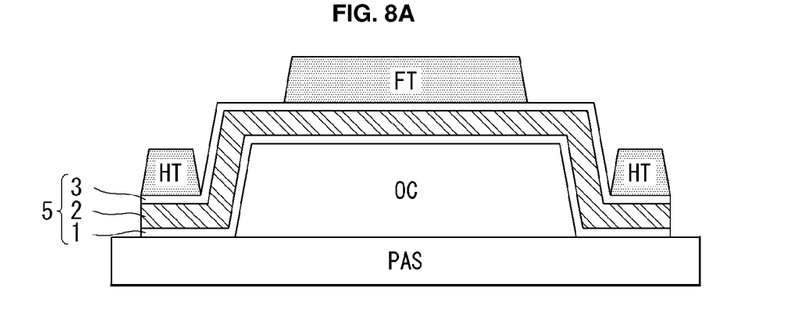
FIGS. 8A to 8E are a diagram illustrating a method of manufacturing an organic light emitting display device according to the present disclosure.

Referring to FIG. 8A, an anode layer 5 is formed on the passivation film PAS to cover the planarization layer OC. The anode layer 5 includes a first electrode material 1, a reflective layer material 2, and a second electrode material 3 which are deposited sequentially. The first and second electrode materials 1 and 3 may be formed of ITO, and the reflective layer material 2 may be formed of molybdenum titanium (MoTi). A pull tone mask FR and a half tone mask HT are aligned on the anode layer 5, and then an exposure process is performed. The full tone mask FR is for patterning the anode ANO, and the half tone mask HT is for forming the cover layer CM.

Figure 8B:
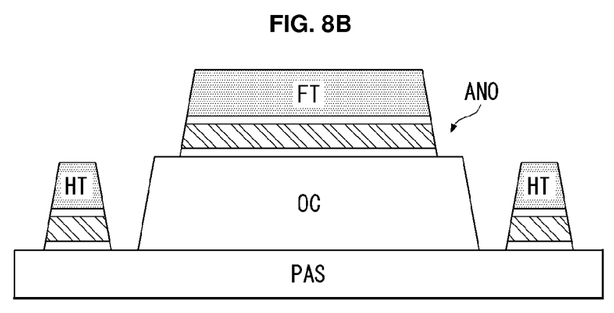

Referring to FIG. 8B, after the exposure process, an etching process is performed to etch that the anode layer 5 while leaving the anode ANO and the cover layer CM left.

Figure 8C:
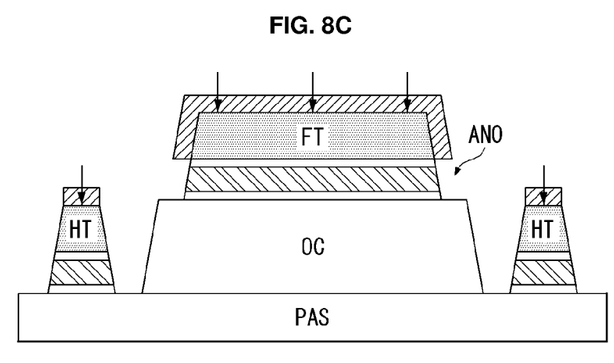

Referring to FIG. 8C, the half tone mask HT is removed by an ashing process. As a result of the ashing process, only the full tone mask FT disposed on the anode ANO is left.

Figure 8D:
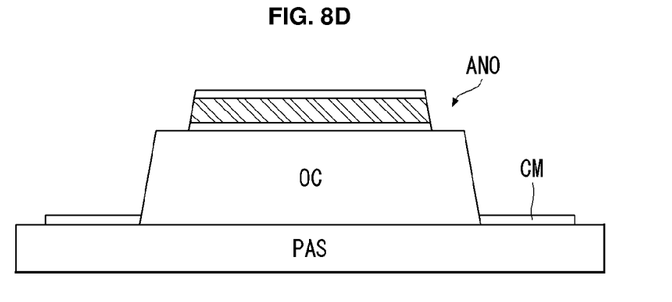

Referring to FIG. 8D, while only the full tone mask FT is left, an etching process is performed to etch the reflective material 2 and the second electrode material 3 positioned on the cover layer CM.

Figure 8E:
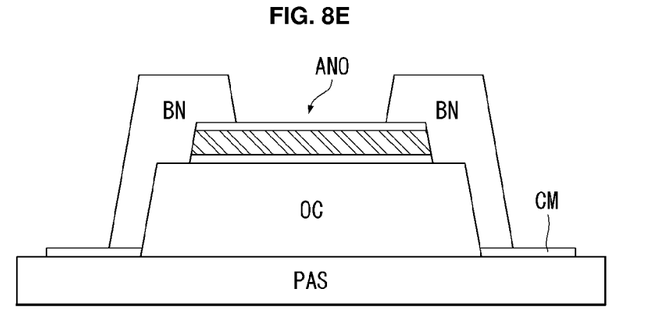

Referring to FIG. 8E, a bank layer is applied all over the front surface and then patterned to form the bank layer BN.

Even the process of manufacturing the second aspect shown in FIG. 6 may also employ the process shown in FIGS. 8A to 8E. However, in the second aspect, only the half tone mask HT is made different in shape compared to the first aspect.

As described above, in the present disclosure, a planarization layer is disposed only in a first area on which an image is displayed, and thus, it is possible to prevent color in a second area, which is a light transmitting unit, from spreading due to the planarization layer. In particular, by arranging a cover layer between the planarization layer and a passivation layer, it is possible to prevent the planarization layer from coming off the passivation film.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device having first and second areas adjacent to each other, comprising:
    an organic light emitting diode disposed at the first area;
    a passivation layer covering the organic light emitting diode at the first area;
    a planarization layer disposed on the passivation film at the first area;
    a cover layer surrounding the planarization layer; and
    a bank layer covering at least an edge of an upper part of the planarization layer and separating the first area from the second area.

2. The organic light emitting display device of claim 1, wherein the second area includes a light transmitting unit which transmits light.

3. The organic light emitting display device of claim 1, further comprising an anode disposed on the planarization layer, wherein the cover layer is formed of a same material as the anode.

4. The organic light emitting display device of claim 3, wherein the anode includes a first transparent electrode disposed on the planarization layer; a reflective layer disposed on the first transparent electrode; and a second transparent electrode disposed on the reflective layer,
    wherein the cover layer is formed of a same material as the first transparent electrode.

5. The organic light emitting display device of claim 1, wherein the bank layer covers a side surface of the planarization layer and has a lower end portion contacting the cover layer.

6. The organic light emitting display device of claim 5, wherein the lower end portion of the bank layer is positioned within the cover layer.

7. The organic light emitting display device of claim 1, wherein the cover layer covers a side surface of the planarization layer.

8. The organic light emitting display device of claim 1, wherein the cover layer covers a portion of a top surface of the planarization layer.

9. The organic light emitting display device of claim 7, wherein the bank layer has a side surface vertically overlapping the planarization layer.

10. An organic light emitting display device having a light emitting area and a light transmitting area adjacent to the light emitting area, comprising:
   an organic light emitting diode disposed at the light emitting area;
   a passivation layer disposed on the organic light emitting diode at the light emitting area;
   a planarization layer disposed only at the first area and disposed on the passivation film; and
   a cover layer securing an adhesion between the passivation layer and the planarization layer.

11. The organic light emitting display device of claim 10, further comprising a bank layer defining the light emitting area and the light transmitting area.

12. The organic light emitting display device of claim 11, the bank layer covers an upper edge portion of the planarization layer.

13. The organic light emitting display device of claim 10, further comprising an anode disposed on the planarization layer.

14. The organic light emitting display device of claim 13, wherein the anode is formed of a same material as the cover layer.

15. The organic light emitting display device of claim 13, wherein the anode includes a first transparent electrode disposed on the planarization layer; a reflective layer disposed on the first transparent electrode; and a second transparent electrode disposed on the reflective layer, wherein the cover layer is formed of a same material as the first transparent electrode.

16. The organic light emitting display device of claim 11, wherein the bank layer covers a side surface of the planarization layer and has a lower end portion contacting the cover layer.

17. The organic light emitting display device of claim 16, wherein the lower end portion of the bank layer is positioned within the cover layer.

18. The organic light emitting display device of claim 11, wherein the cover layer covers a side surface of the planarization layer.

19. The organic light emitting display device of claim 10, wherein the cover layer covers a portion of a top surface of the planarization layer.

20. The organic light emitting display device of claim 18, wherein the bank layer has a side surface vertically overlapping the planarization layer.

* * * * *